United States Patent [19]

Aihara

[11] 4,354,176
[45] Oct. 12, 1982

[54] A-D CONVERTER WITH FINE RESOLUTION

[75] Inventor: Hiroshi Aihara, Gyoda, Japan

[73] Assignee: Takeda Riken Kogyo Kabushikikaisha, Tokyo, Japan

[21] Appl. No.: 178,028

[22] Filed: Aug. 14, 1980

[30] Foreign Application Priority Data

Aug. 27, 1979 [JP] Japan .................................. 54-109565

[51] Int. Cl.³ .................... H03K 13/02; H03K 13/20
[52] U.S. Cl. ........................ 340/347 NT; 340/347 M; 340/347 CC
[58] Field of Search .... 340/347 M, 347 NT, 347 AD, 340/347 CC; 324/99 D

[56] References Cited

U.S. PATENT DOCUMENTS

Re. 28,706  2/1976  Dorey ........................ 340/347 M X
3,577,140  4/1971  Aasnaes ..................... 340/347 M X Primary Examiner—Thomas J. Sloyan
Attorney, Agent, or Firm—Staas & Halsey

[57] ABSTRACT

An analog input signal to be converted is subjected to first integration by an integrator and a reference signal opposite in polarity to the input analog signal is subjected to second integration by the integrator. After the integrator output has passed a predetermined level, a reference signal opposite in polarity to the abovesaid reference signal is subjected to third integration by the integrator for a predetermined period of time and then a reference signal of the same polarity as that in the second integration is subjected to fourth integration by the integrator at a rate of an integral fraction of the integration rate in the second integration. In the second integration, clock pulses are counted by a counter but the counting is interrupted for a period of time substantially twice as long as the third integration period and, in the fourth integration, the counting is performed at a counting stage of one lower order.

17 Claims, 15 Drawing Figures

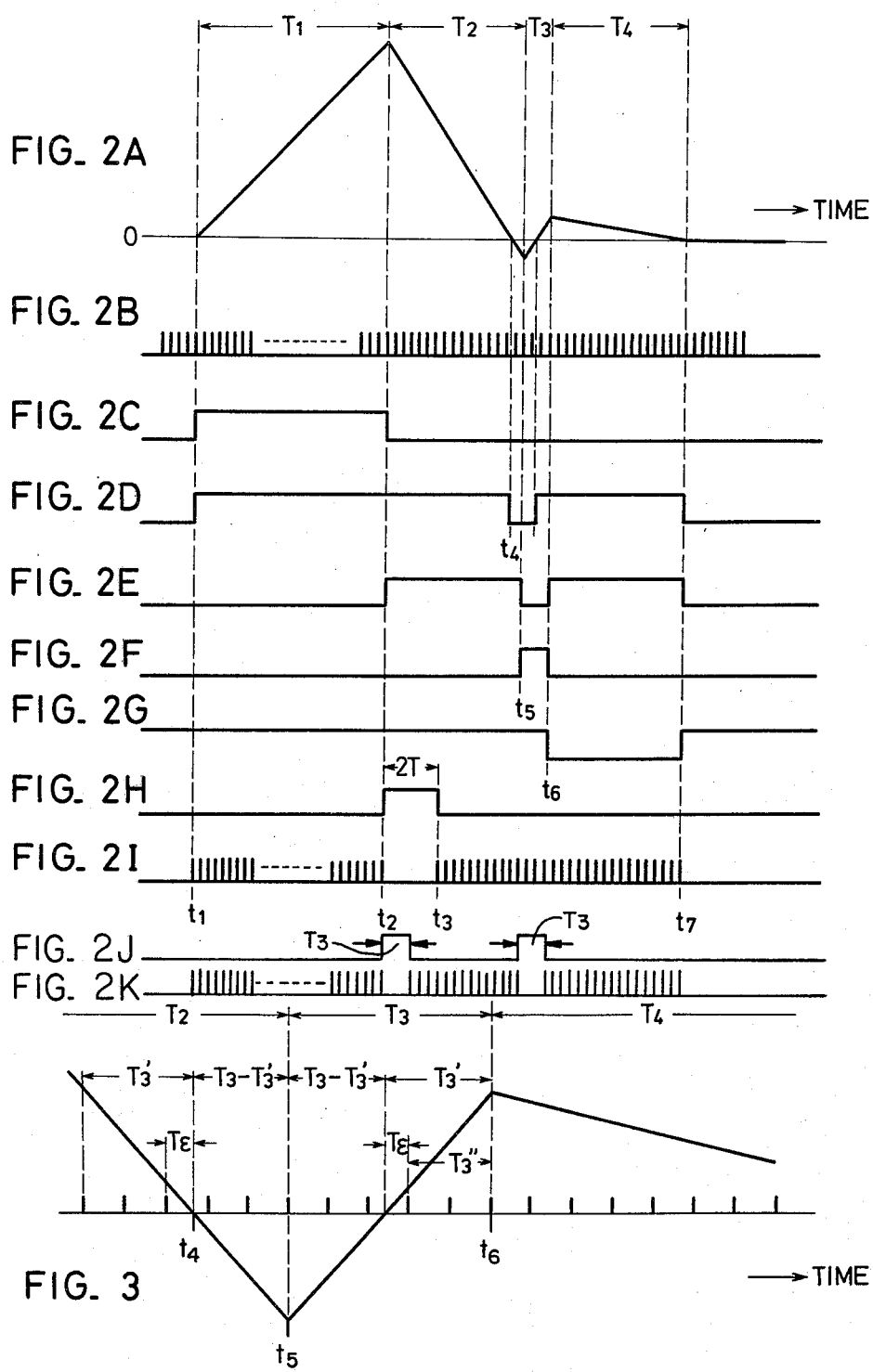

A-D CONVERTER WITH FINE RESOLUTION

BACKGROUND OF THE INVENTION

This invention relates to a ramp type analog-to-digital converter (hereinafter referred to as an A-D converter), and more particularly to a simple-structured but highly accurate A-D converter.

As a system of a ramp type A-D converter, there has been proposed a dual integration type A-D converter. In the dual integration type A-D converter, an analog voltage to be converted is subjected to first integration by an analog integrator for a predetermined period of time and, after the lapse of the period, the supply of the analog voltage to be converted is cut off and a reference voltage $E_0$ reverse in polarity from the analog voltage is subjected to second integration by the analog integrator. At the same time, clock pulses of a known frequency are applied to a counter and, at a moment when the integrated voltage of the analog integrator has returned to its initial reference value, the supply of the clock pulses to the counter is stopped. At this time, the count value of the counter corresponds to the analog voltage to be converted and a digital value is derived from the count value of the counter.

In the dual integration type A-D converter, the moment of termination of the second integration does not always coincide with the clock pulse, resulting in a minute error which depends on the clock pulse interval. A method for converting the minute error to digital form with high resolution is disclosed, for example, in U.S. Pat. No. Re. 28,706 (reissued Feb. 3, 1976). According to this method, reference voltage $E_1$ which has a certain magnitude and is opposite in polarity to an integrated output is abruptly provided at the beginning of the second integration and the second integration is completed in synchronism with a clock pulse immediately after the integrated voltage of the integrator has passed the original reference value $E_0$. Upon completion of the second integration, another abrupt voltage $-E_1$ of the same magnitude as the aforesaid voltage $E_1$ but opposite in polarity thereto is applied to the output side of the integrator and the resulting voltage is subjected to a third integration until it returns to the reference value $E_0$. The third integration is carried out at a speed 1/10 that of the second integration and the counting of the clock pulses by the counter at its counting stage is of one lower order. As a result of this, the minute error occurring at the end of the second integration is converted to digital form during the third integration thus providing for enhanced accuracy in the A-D conversion of lower order digits.

The above triple integration system requires the first and second abrupt voltages $E_1$ and $-E_1$ in addition to the positive and negative reference voltages needed for the second integration. The abrupt voltages $E_1$ and $-E_1$ must be reverse in polarity from each other and exactly equal in absolute value to each other. A circuit for producing these voltages is difficult to obtain and expensive. Furthermore, since this system involves addition and subtraction of analog signals for the triple integration, a switching circuit that is used is complicated in construction, inevitably resulting in the manufacturing cost becoming high.

It is an object of the present invention to provide an A-D converter which does not require an abrupt voltage source but is capable of obtaining accuracy equal to or higher than that obtainable with the abovesaid triple integration type A-D converter.

SUMMARY OF THE INVENTION

According to an example of the present invention, when the first integration is switched to the second integration, the counting operation of a counter is stopped for a certain period of time without providing any abrupt voltage, and the counting operation of the counter is started a predetermined period after the voltage to the analog integrator is switched from the voltage to be converted to a reference voltage. The period of time during which the counting operation of the counter is stopped is selected to be twice as long as the third integration time as will be described later. The second integration comes to an end at a moment when a predetermined number of clock pulses are counted after the integrated voltage of the analog integrator passes the initial reference value and becomes opposite in polarity. After the second integration, a reference voltage opposite in polarity to the reference voltage used in the second integration is subjected to third integration by the analog integrator for a predetermined period of time to change the polarity of the integrated voltage, again. After the third integration, the polarity of the reference voltage is altered and the fourth integration is carried out in the same polarity as in the second integration. The integration speed of the fourth integration is given a weight by reducing the speed to an integral fraction of the integration speed of the second or the third integration. By this weighing the accuracy of lower order digits is enhanced.

BRIEF DESCRIPTION OF THE DRAWINGS

FIGS. 2A to 2K are waveform diagrams explanatory of the operation of the present invention as shown in FIG. 1;

FIG. 3 is an enlarged waveform diagram showing, by way of example, the state of variations in the output from an analog integrator at the end of the second integration period and in the third integration period in the embodiment of FIG. 1;

DESCRIPTION OF THE PREFERRED EMBODIMENTS

Figure 1:
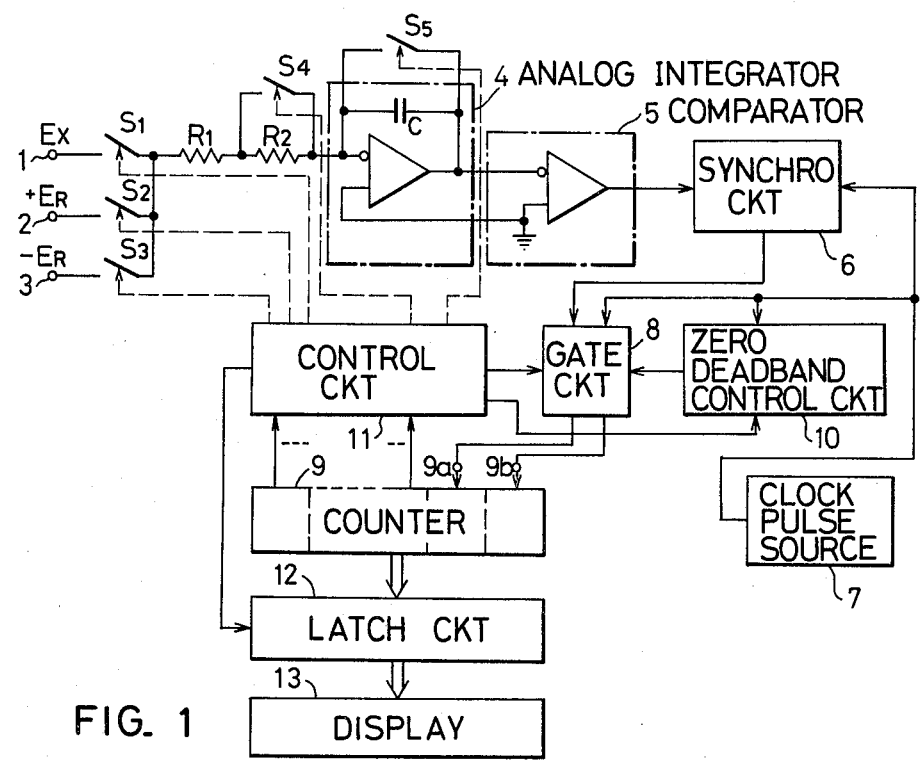
FIG. 1 is a block diagram illustrating an embodiment of the A-D converter of the present invention.

In FIG. 1 illustrating an embodiment of the present invention, an analog input voltage $E_X$ to be converted to digital form is applied to an input terminal 1. The input terminal 1 is connected via a switch $S_1$ and resistors $R_1$ and $R_2$ to an input terminal of an analog integrator 4. To reference voltage input terminals 2 and 3 are supplied positive and negative reference voltages $+E_R$ and $-E_R$, respectively. The reference voltage input terminals 2 and 3 are connected to the connection point of the switch $S_1$ and the resistor $R_1$ respectively through switches $S_2$ and $S_3$ so that the positive and negative reference voltages can be provided to the input terminal of the analog integrator 4 via the series circuit of the resistors $R_1$ and $R_2$ as is the case with the analog input voltage $E_X$. Connected in parallel with the resistor $R_2$ is a switch $S_4$, which is normally held in the ON state to pass on the analog input voltage $E_X$ and the reference voltages $+E_R$ and $-E_R$ to the analog integrator 4 through the resistor $R_1$ alone. The switch $S_4$ is controlled to be held in the OFF state only in a fourth integration period, during which the integration time constant of the analog integrator 4 is given a weight which is an integral multiple of the time constant in the first, second and third integrations. To an integrating capacitor C of the analog integrator 4 a switch $S_5$ is connected in parallel, and upon completion of the A-D conversion, the switch $S_5$ is turned ON to reset the charged voltage of the capacitor C to zero.

To the output side of the analog integrator 4 is connected a level comparator 5, the output from which is supplied to a synchronous circuit 6. The synchronous circuit 6 converts a compared output from the level comparator 5 to a signal synchronized with a clock pulse derived from a clock pulse source 7. The signal thus obtained is provided to a gate circuit 8 to gate-control clock pulses which are applied via the gate circuit 8 from the clock pulse source 7 to a counter 9.

In the present invention, a zero dead band control circuit 10 is provided. The zero dead band control circuit 10 controls, between the starts of the second and fourth integrations, the gate circuit 8 to close it for a period of time $2T_3$ twice as long as a third integration time $T_3$ described later, thereby to prevent the clock pulses from being supplied to the counter 9 for the period of time $2T_3$.

The control for switching to the state of each of the first, second, third and fourth integrations is performed by a control circuit 11. At first, the switch $S_1$ is turned ON by the control circuit 11 at a moment $t_1$, as shown in FIG. 2C, supplying the integrator 4 with the analog input voltage $E_X$. Meanwhile, the switch $S_4$ is held in the ON state as shown in FIG. 2G, as referred to previously, and the switch $S_5$ is held in the OFF state. Simultaneously with turning ON the switch $S_1$, the counter 9 is supplied with the clock pulses (FIG. 2B), as shown in FIG. 2I, and starts to count them. Having counted a predetermined number of clock pulses, the counter 9 provides the count output to the control circuit 11, and by the count signal, the switch $S_1$ is turned OFF at a moment $t_2$, as shown in FIG. 2C, thus terminating the first integration period $T_1$. Supposing that the analog input signal is negative, then, by the first integration, the integrated output from the analog integrator 4 rises, as depicted in FIG. 2A.

Then the reference voltage opposite in polarity to the input analog voltage $E_X$, namely, the positive reference voltage $+E_R$ in this instance is applied during the second integration. Accordingly, at the moment $t_2$ the control circuit 11 turns OFF the switch $S_1$ and, at the same time, turns ON the switch $S_2$ to initiate the second integration, as shown in FIG. 2E. Upon switching to the second integration, the control circuit 11 provides a control signal to the zero dead band control circuit 10, which applies a control signal shown in FIG. 2H to the gate circuit 8 to close it for the predetermined period of time $2T_3$, inhibiting the supply of clock pulses to the counter 9, as depicted in FIG. 2I. At a moment $t_3$ when the predetermined period of time $2T_3$ has ended, the gate circuit 8 is opened and, immediately thereafter, the counter 9 starts to count the clock pulses. During the second integration the integrated output decreases, as shown in FIG. 2A, and at a moment $t_4$ when the integrated voltage of the analog integrator 4 has returned to its initial value, that is, the zero potential, the output from the level comparator 5 returns, for example, as shown in FIG. 2D. Once the output from the level comparator 5 has returned to the low level, and when the number of clock pulses applied thereafter reaches a predetermined value M(M=3 in FIG. 3), the control circuit 11 turns OFF the switch $S_2$ in synchronization with, for example, a third clock pulse at a moment $t_5$, as shown in FIG. 3 terminating the second integration period $T_2$, as illustrated in FIG. 2E.

At the moment $t_5$ when the second integration has ended, the control circuit 11 turns ON the switch $S_3$, as shown in FIG. 2F, supplying the analog integrator 4 with the reference voltage $-E_R$ of the same polarity as the analog input voltage $E_X$. Consequently, the resulting integrated output rises, as shown in FIG. 2A. This state of integration will hereinafter be referred to as the third integration. The time $T_3$ of the third integration is defined to be constant, for example, a duration of five clock pulses as shown in FIG. 3. At a moment $t_6$ when this constant period of time has ended (such as N clock pulses after the zero crossing during the third integration period, N=3 in FIG. 3), the control circuit 11 turns OFF the switch $S_3$, as shown in FIG. 2F, thus completing the third integration.

At the moment $t_6$ when the third integration has ended, the control circuit 11 turns ON the switch $S_2$ again to supply the analog integrator 4 with the reference voltage $+E_R$ of the same polarity as the reference voltage applied during the second integration. At the same time, as illustrated in FIG. 2G, the switch $S_4$ is turned OFF and the integration time constant of the analog integrator 4 is altered to an integral multiple of the time constant used until then, for example, 10 times as long as the latter. By this switching, the fourth integration is initiated. Accordingly, in the fourth integration the voltage of the analog integrator 4 varies at a rate 1/10 that in the second and the third integrations and, in this embodiment, the voltage falls. The counter 9 is a decimal counter and after the moment $t_6$, the clock pulse supply terminal of the counter 9 is switched to a terminal of one lower order; namely, the input terminal of the counter 9 is switched from 9a to 9b so that counting by the counter starts with units that are, for instance in a base-10 counting system, one-tenth of the least significant digit used before. This fourth integration comes to an end at a moment $t_7$ when the integrated voltage of the analog integrator 4 returns to its initial value, i.e. the zero voltage. In other words, the fourth integration terminates at the moment $t_7$ when the output from the level comparator 5 falls from the high level to the low level, as shown in FIG. 2D. At this time, the count value obtained by the counter 9 is latched in a latch circuit 12 and, if necessary, displayed on a display 13. FIG. 2I shows the input clock pulses to the counter 9.

A description will be given of the reason for which a very small error caused at the end of the second integration in the conventional system can be converted to digital form with high accuracy, using the count value of the fourth integration period $T_4$ in the arrangement described above. The fourth integration is performed at a rate ten times smaller than the integration time constant of the third integration until the output from the analog integrator 4 is reduced to zero. As shown in FIG. 3, the fourth integration period $T_4$ becomes $10T_3' = 10T_\epsilon + 10T_3''$ which is ten times longer than the period, $T_3' = T_\epsilon + T_3''$, during which the integrated voltage of the analog integrator 4 is positive in the third integration period $T_3$. This means that the time interval between the moment $t_4$ of the integrated output becoming zero in the second integration and the immediately preceding clock, that is, the minute error $T_\epsilon$ during the second integration in the prior art system, is magnified ten times larger in the fourth integration. Incidentally, $T_3''$ which is counted by applying the clock pulses to the terminal 9a, is an integral multiple of the clock interval, as is apparent from FIG. 3. Accordingly, $10T_3''$ which is counted by applying the clock pulse to the terminal 9b of one lower order than the terminal 9a, is carried up to the order of the terminal 9a and does not remain at the order of the terminal 9b. As a consequence of the counting of $10T_3'$ which is counted by applying the clock pulses to the terminal 9b, only $10T_\epsilon$ remains at the order of the terminal 9b; namely, only the count result of $T_\epsilon$, magnified ten times, remains at the lower order digit of the counter 9.

Next, a description will be given of the reason for which it is possible to remove, by the inhibition of counting the clock pulses for the period of time $2T_3$ at the beginning of the second integration, the count value for $10T_3''$ which is counted extra during the fourth integration, the count value which is counted in the third integration period $T_3$ and the count value which is counted while the integrated voltage of the analog integrator 4 is negative during the second integration. That is, the time $10T_3''$ of the fourth integration period is equivalent to the time $T_3''$ of the third integration period. On the other hand, the time during which the analog integrated voltage is negative in the second integration period is equal to the time $T_3 - T_3'$ in the third integration period. Therefore, the sum of the time $T_3 - T_3'$ during which the analog integrated voltage is negative in the second integration period and the time $T_3'$ counted in the fourth integration period, that is, one tenth of the time $T_4$, is equal to the time $T_3$ of the third integration. Accordingly, the sum of this time $T_3$ and the time $T_3$ in the third integration period is $2T_3$. After all, by inhibiting the counting of the clock pulses for the time $2T_3$ in the second integration period, an unnecessary count value can be eliminated and the minute error $T_\epsilon$ occurring at the end of the second integration can be converted to digital form with ten-fold accuracy in this embodiment.

Figure 4:
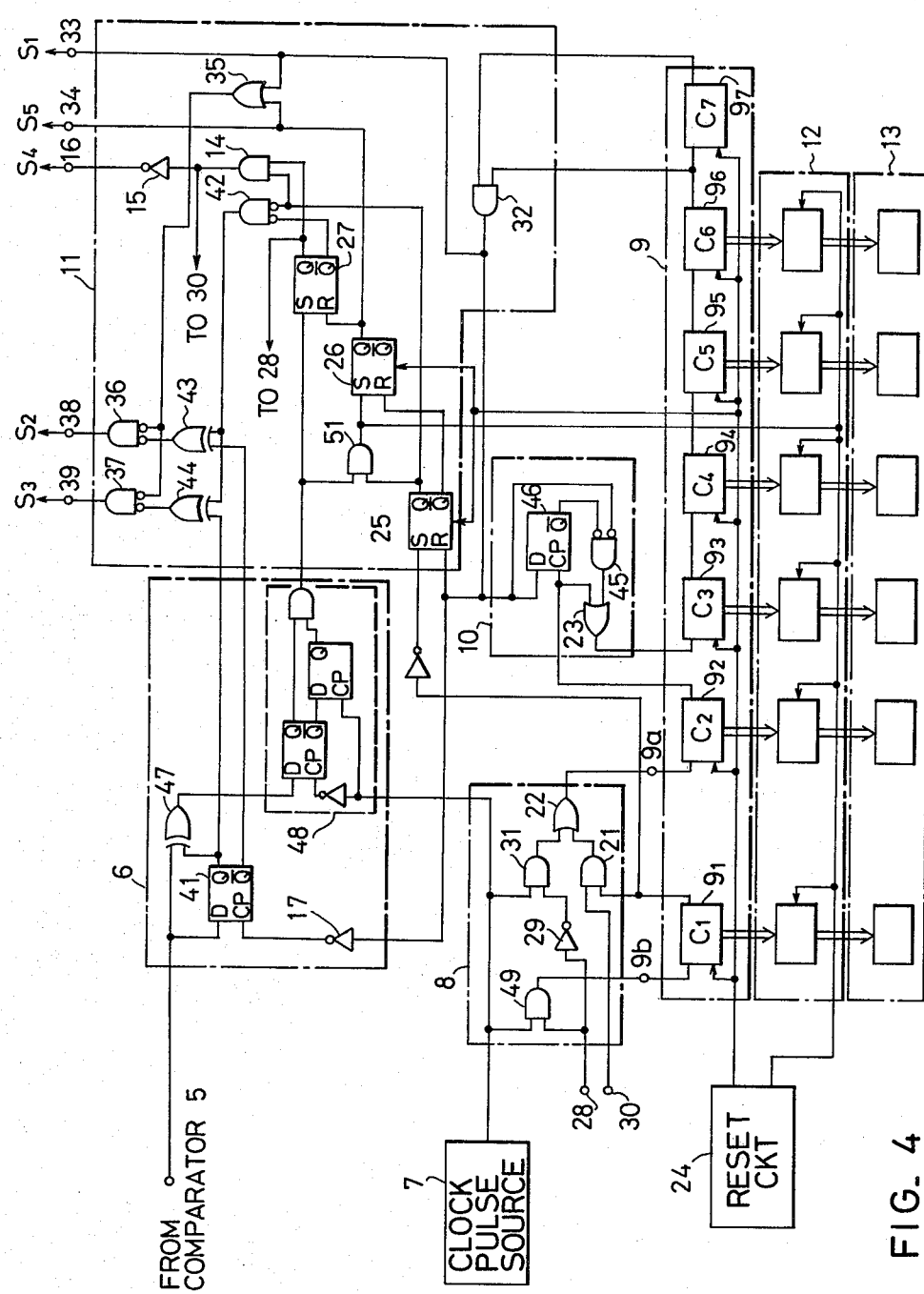
FIG. 4 is a logic circuit diagram illustrating specific operative examples of a synchronous circuit 6, a zero dead band control circuit 10 and a control circuit 11 used in the embodiment of FIG. 1.

Next, a description will be given, with reference to FIG. 4, of a specific example of the control circuit and the others used in FIG. 1. In this example, the interval $2T_3$ during which the clock pulses are not counted is divided into two separate intervals each of $T_3$, the first one starting from the beginning of the second integration and the second one from the beginning of the third integration, the latter interval being itself the third integration period $T_3$, as shown in FIGS. 2J and 2K. During each of the separated intervals of $T_3$, clock pulses are not counted and the total number of the omitted clock pulses is the same as in the case of FIG. 2I. The counter 9 is formed by a cascade connection of decimal counters $9_1$ to $9_5$ which is followed by a cascade connection of binary counters $9_6$ and $9_7$. The decimal counter $9_1$ of the least significant digit performs a counting operation in the fourth integration period and the carry output from the decimal counter $9_1$ is provided to the decimal counter $9_2$ via an AND circuit 21 and an OR circuit 22 in the gate circuit 8. The carry output from the decimal counter $9_2$ is applied to the decimal counter $9_3$ via an OR circuit 23 in the dead band control circuit 10. Upon turning ON of the power source and after latching the count value of the counter 9 in the latch circuit 12, a reset circuit 24 provides an initial setting signal, by which the counter 9 is reset and the Q output of each of flip-flops 25 and 26 is set to a high level "1". Consequently, the Q output from the flip-flop 26 closes the switch S5 to discharge the capacitor of the integrator 4, and at the same time is applied to a flip-flop 27 to reset it, lowering its Q output to a low level "0". The Q output from the flip-flop 27 is provided to an AND circuit 31 via a terminal 28 of the gate circuit 8 and an inverter 29.

Accordingly, since the high level "1" is supplied to one input of the AND circuit 31 upon application of the initial setting signal, the clock pulses from the clock pulse source 7 are supplied via the AND circuit 31 and the OR circuit 22 to the input terminal 9a of the counter 9, wherein they are counted. Until both the outputs from the binary counters $9_6$ and $9_7$ are high level "1", the switches S1, S2 and S3 are kept open. When the outputs of these binary circuits both assume high level, the output from the AND circuit 32 becomes high and by the rise of the output from the AND circuit 32 the flip-flops 25 and 26 are reset; the Q output from the flip-flop 26 immediately becmes low-level; the control signal derived from a terminal 34 for the switch S5 becomes low-level to turn OFF the switch S5; and the switch S1 is turned on, thereby starting the first integration. At the same time the high-level output at the terminal 33 is provided via an OR circuit 35 to one input of each of NOR circuits 36 and 37 to keep their outputs at output terminals 38 and 39 low-level, so that the switches S2 and S3 are held open. The low-level Q output from the flip-flop 27 is applied to one input of the AND circuit 14, whose low-level output is inverted by an inverter 15 and then provided as a control signal for the switch S4 from a terminal 16, thus turning ON the switch S4.

When the switch S4 is in the ON state and a carry output is derived from the decimal counter $9_5$, the output from the binary counter $9_6$ becomes low-level, and consequently the output from the AND circuit 32, that is, the switch S1 control signal from the terminal 33 also becomes low-level to turn OFF the switch S1, putting an end to the first integration period. This fall is provided via an inverter 17 to a clock terminal of a D flip-flop 41 in the synchronous circuit 6 and the output from the level comparator 5 is written in the D flip-flop 41. Accordingly, if the signal Ex to be measured which is being applied to the input terminal 1 at that time is a negative potential, then the output from the level comparator 5 is high level and it is written in the D flip-flop 41 to make its Q output high-level. On the other hand, the flip-flops 25 and 27 are both in their reset state, and the low-level Q output of the former and the high-level $\bar{Q}$ output of the latter are applied to a NOR circuit 42 to make its output low-level. This low-level output from the NOR circuit 42 is applied to exclusive OR circuits 43 and 44, and the Q or $\bar{Q}$ output from the flip-flop 41 becomes high-level depending on whether the input Ex to be measured is negative or positive. In the present example, since the input Ex is negative, the $\bar{Q}$ output from the flip-flop 41 is high-level, and accordingly the output from the exclusive OR circuit 43 is low-level and is applied to the NOR circuit 36. Consequently, when the switch S1 is turned OFF, that is, when the output from the OR circuit 35 becomes low-level, the output at the terminal 38 becomes high-level to turn ON the switch S₂, starting the second integration period.

Upon turning OFF the switch S₁, the output from the AND circuit 32 becomes low-level and this output is applied to a NOR circuit 45 and a data terminal of a D flip-flop 46 in the zero dead band control circuit 10. To the NOR circuit 45 is also supplied the $\bar{Q}$ output from the flip-flop 46, and since the flip-flop 46 had written therein the high level while the switch S₁ was in the ON state, the high-level output from the NOR circuit 45 has been provided via an OR circuit 23 to the input of the decimal counter 9₃ since the switch S₁ was turned OFF. Consequently, the first one of carry outputs from the decimal counter 9₂ in the second integration period is not counted in the counter 9₃ but since a low level is written by the first carry output in the flip-flop 46, the output from the NOR circuit 46 becomes low-level and the subsequent carry outputs from the counter 9₂ are counted by the counter 9₃. In this way, the counter 9 interrupts the counting of ten clock pulses from the clock pulse source 7. The period during which the counting of the ten clock pulses is interrupted is the time T₃ equivalent to half of the time 2T₃ described previously.

In the second integration, the output from the integrator 4 becomes zero and the output from the level comparator 5 is inverted, in this example, from the high level to the low level, but the level comparator output is supplied to an exclusive OR circuit 47 and a data terminal of the D flip-flop 41 in the synchronous circuit 6. Since the D flip-flop 41 has stored therein the non-inverted state of the output from the level comparator 5, when the comparator output is inverted, the output from the exclusive OR circuit 47 necessarily becomes high-level and is applied to a synchronous differentiation circuit 48, and the clock pulse from the clock pulse source 7 immediately after the output from the exclusive OR circuit 47 becomes high-level is provided via the synchronous differentiation circuit 48 to the flip-flop 27 to set it. Accordingly, the $\bar{Q}$ output from the flip-flop 27 becomes the low level "0" and both inputs to the NOR circuit 42 become low-level to provide therefrom a high level output. The output from the exclusive OR circuit 43 becomes high-level but the output from the exclusive OR circuit 44 becomes low-level, and the output from the NOR circuit 36 becomes low-level to turn OFF the switch S₂. (Whereby M = 1 in this embodiment.) As a consequence, the NOR circuit 37 yields a high-level output to turn ON the switch S₃, initiating the third integration period.

The flip-flop 27 is set and its high-level Q output is provided to the terminal 28, so that this high-level output is applied to the AND circuit 49 and, at the same time, to the AND circuit 31 via the inverter 29 as an inverted signal. Accordingly, the clock pulses from the clock pulse source 7 are applied via the AND circuit 49 to the decimal counter 9₁ wherein they are counted. That is, in the example of this embodiment, the third integration period is counted at the counter 9₁ of lower order. However, since the output of the AND circuit 14 still holds a low-level, the AND circuit 21 is kept closed during the third integration period T₃ which, in this example, is equivalent to a length of ten clock pulses and a carry output from the decimal counter 9₁ is not supplied to the decimal counter 9₂. Thus, together with the time T₃ interrupted by the dead band control circuit 10, the total interruption becomes equivalent to the time 2T₃. By the carry output from the decimal counter 9₁ the flip-flop 25 in the control circuit 11 is set. The high level of the Q output from the flip-flop 25 is applied to an AND circuit 51 and the NOR circuit 42. As a result of this, the output from the NOR circuit 42 becomes low-level again, and consequently the outputs from the exclusive OR circuits 43 and 44 become low- and high-level, respectively, and the outputs from the NOR circuits 36 and 37 become high- and low-level, respectively, thus turning ON the switch S₂ again and OFF the switch S₃ to terminate the third integration period. (Whereby N = 10 in this embodiment.) Furthermore, since both inputs to the AND circuit 14 are made high-level when the flip-flop 25 is set, the high-level output of the AND circuit 14 is fed via a terminal 30 to the AND circuit 21 to open it, at the same time the output at the terminal 16 becomes low-level to turn OFF the switch S₄, starting the fourth integration period.

In the fourth integration period, when the output from the level comparator 5 is inverted, that is, when the output from the analog integrator 4 becomes zero-voltage, since the flip-flop 41 in the synchronous circuit 6 has written therein a high level in this example, the output from the exclusive OR circuit 47 becomes high-level and the clock pulse derived from the clock pulse source 7 immediately thereafter is derived from the synchronous differentiation circuit 48 as in the case of the termination of the second integration period T₂. The clock pulse thus derived from the synchronous differentiation circuit 48 is applied as a latch command to the latch circuit 12 via the AND circuit 51 in the control circuit 11 to latch the content of the counter 9 in the latch circuit 12. This latch command is also provided to the reset circuit 24 to generate therefrom an initial setting signal after a certain period time, and the abovesaid operations are repeated.

As will be appreciated from the foregoing description, according to the present invention, the minute error which occurs at the end of the second integration can be converted to digital form with high accuracy without the necessity of application of the abrupt voltage referred to previously. Furthermore, according to the present invention, since the reference voltage sources may be the positive and negative reference voltage sources $+E_R$ and $-E_R$ heretofore employed, the reference voltage sources can be obtained at low cost. Moreover, since use is made of the same reference voltage sources $+E_R$ and $-E_R$ for the second, the third and the fourth integration, the switching circuit therefore can also be simplified in construction and obtained at low cost. In addition, since the end of the second integration is defined by the moment when a predetermined number of clock pulses are counted from the moment immediately after the analog integrated voltage becomes negative and since the third integration period T₃ can also be defined by the time for counting a predetermined number of clock pulses, the on-off control of the switches S₁, S₂, S₃, S₄ and S₅ can be performed by a logic circuit arrangement, as described previously in connection with FIG. 4. Accordingly, the control circuit 11 for the switches S₁, S₂, S₃, S₄ and S₅ can also be simple-structured while attaining a high accuracy of AD conversion.

In the foregoing, the present invention has been described in connection with the case where the analog input voltage $E_X$ is negative, but the invention is also similarly applicable to the case where the analog input voltage $E_X$ is positive. In this case, the integrated voltage of the analog integrator 4 during the first integration is negative and the second integration starts with some negative voltage. Accordingly, at the end of the second integration the analog integrated voltage is positive. Therefore, the reference voltages used in the integrations are reverse in polarity from the reference voltages used in the foregoing example. The selection of these reference voltages is automatically carried out, discriminating the polarity of the analog input voltage $E_X$ by the synchronous circuit 6 and the control circuit 11 shown in FIG. 4.

Figure 5:
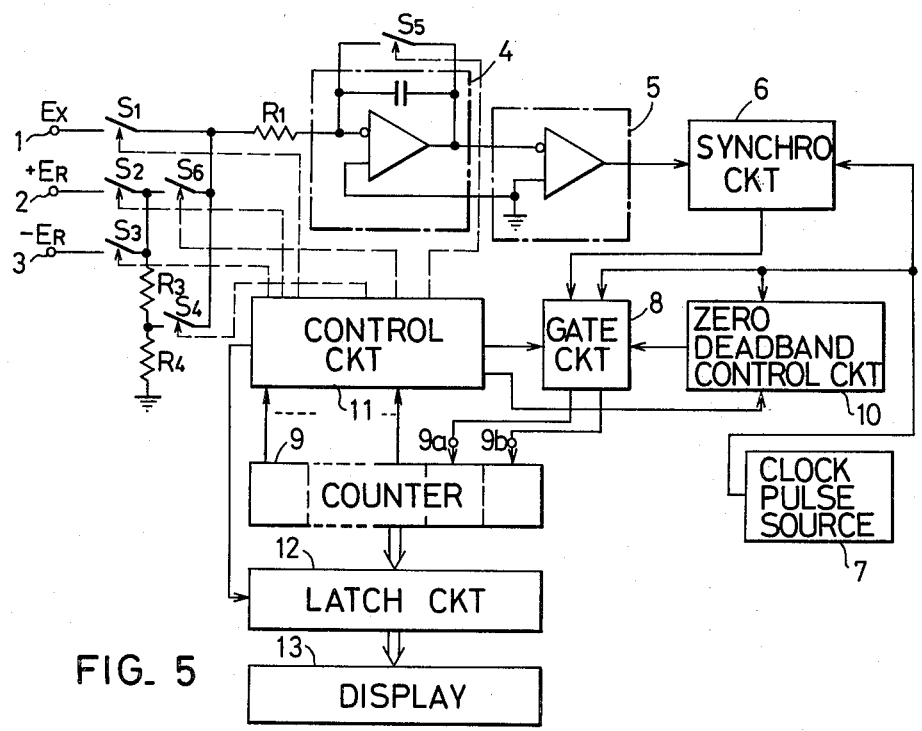
FIG. 5 is a block diagram illustrating another embodiment of the A-D converter of the present invention.

In the above embodiment, during the fourth integration the switch $S_4$ is held in the OFF state and the integration time constant is weighted ten times as large as the time constant for the first, the second and the third integrations, but it is also possible to adopt such a circuit arrangement of another embodiment of the present invention as shown in FIG. 5 in which the reference voltages supplied to the reference voltage input terminals 2 and 3 are each voltage-divided by resistors $R_3$ and $R_4$ and the voltage-divided reference voltage is provided via the switch $S_4$ to the analog integrator 4. Also in this case, by selecting the voltage dividing ratios of the resistors $R_3$ and $R_4$ to be 1/10, for example, the fourth integration time $T_4$ can be weighted ten times as large as the second and the third integration time; accordingly, the minute error can be converted to digital form with ten-fold resolution. In this case, the control circuit 11 controls the switch $S_6$ with the output at the terminal 16 and the switch $S_4$ with the output from the AND circuit 14 in FIG. 4. It will easily be understood that in the embodiments of FIGS. 1 and 5, by reducing the integration rate down to, for instance, 1/100 and 1/1000, the A-D conversion can be carried out with 100- and 1000-fold resolution. Furthermore, in the foregoing embodiments, the gate circuit 8 is controlled by the zero dead band control circuit 10 to be closed twice for a period of time equivalent to twice as long as the third integration time $T_3$ at the moments of starting the second and third integrations, but the gate circuit 8 may also be closed at any time in the second or the third integration period, provided that the total closing period is twice the third integration period $T_3$.

It will be apparent that many modifications and variations may be effected without departing from the scope of the novel concepts of this invention.

What is claimed is:

1. An A-D converter comprising:
   an integrator;
   first supply means for supplying the integrator with an analog input signal to be converted by integration during a first integration period from a predetermined level to obtain an integrated output corresponding to the magnitude of the analog input signal;
   a first reference signal source for providing a first reference voltage of opposite polarity than that of said analog input signal;
   a clock pulse source for generating clock pulses;
   second supply means for supplying, in synchronism with the clock pulses, the integrator with said first reference signal, for integration for a second integration period terminating with the Mth clock pulse after the integrator output passes said predetermined level, where M is a non-zero positive integer;
   a second reference signal source for providing a second reference signal of the same magnitude as the first reference signal but opposite in polarity;
   third supply means for supplying, in synchronism with the clock pulses, the integrator with said second reference signal, for integration for a third integration period, said third integration period being selected to end on the Nth clock pulse after the integrator output again crosses said predetermined level, N being larger than one;
   fourth supply means for supplying, in synchronism with the clock pulses, the integrator with a third reference signal of the same polarity as said first reference signal for causing the output of said integrator to change at a rate of an integral fraction of the integration rate of the integrator during said second integration period, until the integrator output reaches said predetermined level, thus defining a fourth integration period;
   a one-directional counter for selectively counting the clock pulses during said second and third integration period, said counter having plural counting stages each corresponding to a respective bit of the count of said clock pulses;
   zero dead band control means for interrupting the counting operation of the counter selectively in said second and third integration periods by a count number corresponding to a period of time that is twice as long as said third integration period, and
   means for switching, for said fourth integration period, the counting stage of the counter supplied with the clock pulses to a counting stage of one lower order than for said counting during said second integration periods.

2. The converter of claim 1, wherein said third reference signal is identical with the first reference signal, and the integration time constant of the integrator is selected to be an integral multiple of the integration time constant of the second integrating means.

3. The converter of claim 1, wherein said third reference signal is an integral fraction of the first reference signal in absolute value.

4. The converter of claim 1, 2 or 3, wherein the zero dead band control means responds to the completion of the first integration period to interrupt the counting of the counter for a predetermined number of clock pulses at the beginning of the second integration period.

5. The converter of claim 4, wherein said dead band control means is a circuit for interrupting the counting operation of the counter in the second integration period for a period of time that is equivalent to said third integration period.

6. The converter of claim 1, 2 or 3, wherein said dead band control means comprises
   a dead band control circuit for interrupting the counting operation of the counter from the start of the second integration period for a period of time equivalent to the third integration period, and
   means for switching, at the beginning of the third integration period, the counting stage of the counter supplied with the clock pulses in the second integration period to a counting stage of one lower order and for interrupting the carry output therefrom from said lower order stage to the next higher stage of said counter, thereby to reduce the number of said clock pulses that would otherwise be counted at said next higher stage by a number corresponding to the third integration period, and wherein the count of said lower order stage is the same at the end of said third integration period as at the beginning thereof.

7. The converter of claim 6, comprising
said counter counting said clock pulses during said first integration period, and
wherein the zero dead band control circuit comprises
a D flip-flop for reading therein, by the clock pulses counted by the counter in the first and the second integration periods, a control signal assuming one state of logic in the first integration period and the other state of logic in the second integration period,
a circuit supplied with the output from the D flip-flop and the control signal to yield an inhibit pulse at the beginning of the second integration period, and
a gate for inhibiting, by the inhibit pulse, the supply of only one clock pulse to the counter at the beginning of the second integration period.

8. The converter of claim 1, 2 or 3, comprising
a level comparator for detecting the passage of the integrator output through said predetermined level in the second integration period, and
a synchronous differentiation circuit selectively supplied with the output from the level comparator and said clock pulses to detect the occurrence of said Mth clock pulse after the inversion of the level comparator output to produce a command signal for terminating the second integration period.

9. The converter of claim 8, wherein a termination command is produced for terminating said third integration period, said converter comprising a first flip-flop (27) which is reset at the beginning of said first integration period and set by said termination command signal for said second integration period,
a second flip-flop (25) which is reset at the beginning of the first integration period and set by said third integration period termination command, and
a circuit for producing a signal for said switching means by the outputs from the first and second flip-flops in said third integration period.

10. The converter of claim 9, comprising
a gate circuit controlled by the output from the first flip-flop to switch, upon termination of the second integration period, the supply of the clock pulses from the clock pulse source to the counter to its counting stage of one lower order than the counting stage supplied with the clock pulses in the second integration period and to interrupt the carry output from the lower-order counting stage to the higher counting stage.

11. The converter according to claim 6, wherein the first carry output from the lower-order counting stage is used as a command signal for terminating said third integration period.

12. An A-D converter for providing a high resolution measurement of the value of an analog input signal, comprising
an integrator for integrating said input signal during a first integration period to provide an output corresponding to the value of said analog input signal,
a comparator for detecting when the output of said integrator crosses a predetermined level,
a source of first and second reference voltages of equal magnitude and opposite polarity,
a source of clock pulses for synchronizing the operation of said comparator during said first integration period and during second, third and fourth integration periods for providing said reference voltages selectively to said integrator,
switching means (1) for providing the one of said first and second reference voltages having the opposite polarity than said analog input voltage to said integrator during said second integration period, until the Mth clock pulse after said comparator detects the crossing of the output of said integrator across said predetermined level, where M is a non-zero integer, (2) for providing the other of said reference voltages to said integrator during said third integration period until the Nth clock pulse after said comparator again detects the crossing of the output of said integrator across said predetermined level, where N is larger than one and (3) for providing the one of said first and second reference voltages, that was applied to said integrator during said second integration period to said integrator, to said integrator during said fourth integration period in a manner causing the output of said integrator to change at a rate equal to an integral fraction of the rate of change thereof during said second integration period,
a one-directional counter having plural stages for selectively counting said clock pulses into selected ones of said stages during said second and third integration periods, and into the lowest order stage of said counter during the entire portion of said fourth integration period, and
a zero-dead band control circuit for controlling said selective counting of said clock pulses during said second and third integration periods so that said clock pulses are effectively not counted for a period equal to twice said third integration period,
wherein the output of said integrator at the end of the first integration period is converted into a count value in said stages of said counter that precisely accounts for the time difference between one of said clock pulses and the time when said output of said comparator crosses said predetermined level during said second integration period, to yield said high resolution measurement.

13. The converter of claim 12, said switching means comprising
a control circuit, for controlling the application of said reference voltage to said integrator
a synchro circuit for synchronizing said clock pulses with the output of said comparator,
a gate circuit receiving said clock pulses, an output of said synchro circuit, the output of said zero dead band control circuit, and an output of said control circuit, for controlling said counting of said clock pulses into the respective stages of said counter.

14. The converter of claim 13, wherein said first reference signal is applied to said integrator during said fourth integration period, and the integration time constant of the integrator is selected to be an integral multiple of the integration time constant of the integrator during the second integration period.

15. The converter of claim 13, wherein the voltage supplied to said integrator during the fourth integration period is an integral fraction of the reference voltage applied.

16. The converter of claim 1, 2, 3, 12, 13, 14 or 15, wherein $M=3$ and $N=3$.

17. The converter of claim 1, 2, 3, 12, 13, 14 or 15, wherein $M=1$ and $N=10$.

* * * * *

UNITED STATES PATENT AND TRADEMARK OFFICE
CERTIFICATE OF CORRECTION

PATENT NO. : 4,354,176

DATED : 12 October 1982

INVENTOR(S) : HIROSHI AIHARA

It is certified that error appears in the above-identified patent and that said Letters Patent is hereby corrected as shown below:

IN THE FIGURES:
   In Fig. 2H, "2T" should be --$2T_3$--.

IN THE SPECIFICATION:
   Column 6, line 26, "becmes" should be --becomes--.

IN THE CLAIMS, REPLACE ISSUED CLAIMS AS FOLLOWS:
   4. An A-D converter for providing a high resolution measurement of the value of an analog input signal, comprising
      an integrator for integrating said input signal during a first integration period to provide an output corresponding to the value of said analog input signal,
      a comparator for detecting when the output of said integrator crosses a predetermined level,
      a source of first and second reference voltages of equal magnitude and opposite polarity,
      a source of clock pulses for synchronizing the operation of said comparator during said first integration period and during second, third and fourth integration periods for providing said reference voltages selectively to said integrator,
      switching means (1) for providing the one of said first and second reference voltages having the opposite polarity than said analog input voltage to said integrator during said second integration period, until the Mth clock pulse after said comparator detects the crossing of the output of said integrator across said predetermined level, where M is a non-zero

UNITED STATES PATENT AND TRADEMARK OFFICE
CERTIFICATE OF CORRECTION

PATENT NO. : 4,354,176
DATED : 12 October 1982
INVENTOR(S) : HIROSHI AIHARA

It is certified that error appears in the above-identified patent and that said Letters Patent is hereby corrected as shown below:

integer, (2) for providing the other of said reference voltages to said integrator during said third integration period until the Nth clock pulse after said comparator again detects the crossing of the output of said integrator across said predetermined level, where N is larger than one and (3) for providing the one of said first and second reference voltages, that was applied to said integrator during said second integration period, to said integrator during said fourth integration period in a manner causing the output of said integrator to change at a rate equal to an integral fraction of the rate of change thereof during said second integration period, a one-directional counter having plural stages for selectively counting said clock pulses into selected ones of said stages during said second and third integration periods, and into the lowest order stage of said counter during the entire portion of said fourth integration period, and a zero-dead band control circuit for controlling said selective counting of said clock pulses during said second and third integration periods so that said clock pulses are effectively not counted for a period equal to twice said third integration period, wherein the output of said integrator at the end of the first integration period is converted into a count value in said stages of said counter that precisely accounts for the time difference between one of said clock pulses and the time when said output of said comparator crosses said predetermined level

UNITED STATES PATENT AND TRADEMARK OFFICE
CERTIFICATE OF CORRECTION

PATENT NO. : 4,354,176

DATED : 12 October 1982

INVENTOR(S) : HIROSHI AIHARA

It is certified that error appears in the above-identified patent and that said Letters Patent is hereby corrected as shown below:

during said second integration period, to yield said high resolution measurement.

5. The converter of claim 4, said switching means comprising a control circuit, for controlling the application of said reference voltage to said integrator a synchro circuit for synchronizing said clock pulses with the output of said comparator, a gate circuit receiving said clock pulses, an output of said synchro circuit, the output of said zero dead band control circuit, and an output of said control circuit, for controlling said counting of said clock pulses into the respective stages of said counter.

6. The converter of claim 5, wherein said first reference signal is applied to said integrator during said fourth integration period, and the integration time constant of the integrator is selected to be an integral multiple of the integration time constant of the integrator during the second integration period.

7. The converter of claim 5, wherein the voltage supplied to said integrator during the fourth integration period is an integral fraction of the reference voltage applied.

8. The converter of claim 1, 2, 3 or 5, wherein the zero dead band control means responds to the completion of the first integration period to interrupt the counting of the counter for a predetermined number of clock pulses at the beginning of the second integration period.

9. The converter of claim 1, 2, 3 or 5, wherein said dead band control means comprises

UNITED STATES PATENT AND TRADEMARK OFFICE
CERTIFICATE OF CORRECTION

PATENT NO. : 4,354,176

DATED : 12 October 1982

INVENTOR(S) : HIROSHI AIHARA

It is certified that error appears in the above-identified patent and that said Letters Patent is hereby corrected as shown below:

a dead band control circuit for interrupting the counting operation of the counter from the start of the second integration period for a period of time equivalent to the third integration period, and means for switching, at the beginning of the third integration period, the counting stage of the counter supplied with the clock pulses in the second integration period to a counting stage of one lower order and for interrupting the carry output there from from said lower order stage to the next higher stage of said counter, thereby to reduce the number of said clock pulses that would otherwise be counted at said next higher stage by a number corresponding to the third integration period, and wherein the count of said lower order stage is the same at the end of said third integration period as at the beginning thereof.

10. The converter of claim 1, 2, 3 or 5, comprising a level comparator for detecting the passage of the integrator output through said predetermined level in the second integration period, and a synchronous differentiation circuit selectively supplied with the output from the level comparator and said clock pulses to detect the occurrence of said Mth clock pulse after the inversion of the level comparator output to produce a command signal for terminating the second integration period.

11. The converter of claim 8, wherein said dead band control means is a circuit for interrupting the counting operation of the counter in the second integration period for a

UNITED STATES PATENT AND TRADEMARK OFFICE
CERTIFICATE OF CORRECTION

PATENT NO. : 4,354,176

DATED : 12 October 1982

INVENTOR(S) : HIROSHI AIHARA

It is certified that error appears in the above-identified patent and that said Letters Patent is hereby corrected as shown below:

period of time that is equivalent to said third integration period.

12. The converter according to claim 9, wherein the first carry output from the lower-order counting stage is used as a command signal for terminating said third integration period.

13. The converter of claim 9, comprising
    said counter counting said clock pulses during said
        first integration period, and
  wherein the zero dead band control circuit comprises
a D flip-flop for reading therein, by the clock pulses
        counted by the counter in the first and second
        integration periods, a control signal assuming
        one state of logic in the first integration period
        and the other state of logic in the second
        integration period,
    a circuit supplied with the ouput from the D flip-flop
        and the control signal to yield an inhibit pulse
        at the beginning of the second integration period,
        and
    a gate for inhibiting, by the inhibit pulse, the supply
        of only one clock pulse to the counter at the
        beginning of the second integration period.

14. The converter of claim 10, wherein a termination command is produced for terminating said third integration period, said converter comprising a first flip-flop (27) which is reset at the beginning of said first integration period and set by said termination command signal for said second integration period,
    a second flip-flop (25) which is reset at the beginning
        of the first integration period and set by said
        third integration period termination command, and

UNITED STATES PATENT AND TRADEMARK OFFICE
CERTIFICATE OF CORRECTION

PATENT NO. : 4,354,176

DATED : 12 October 1982

INVENTOR(S) : HIROSHI AIHARA

It is certified that error appears in the above-identified patent and that said Letters Patent is hereby corrected as shown below:

a circuit for producing a signal for said switching means by the outputs from the first and second flip-flops in said third integration period.

15. The converter of claim 14, comprising
a gate circuit controlled by the output from the first flip-flop to switch, upon termination of the second integration period, the supply of the clock pulses from the clock pulse source to the counter to its counting stage of one lower order than the counting stage supplied with the clock pulses in the second integration period and to interrupt the carry output from the lower-order counting stage to the higher counting stage.

16. The converter of claim 1, 2, 3, 4, 5, 6 or 7, wherein $M=3$ and $N=3$.

17. The converter of claim 1, 3, 3, 4, 5, 6 or 7, wherein M1 and $N=10$.

Signed and Sealed this

Thirty-first Day of January 1984

[SEAL]

Attest:

GERALD J. MOSSINGHOFF

Attesting Officer     Commissioner of Patents and Trademarks